United States Patent
Meyer et al.

(10) Patent No.: US 10,260,771 B2
(45) Date of Patent: Apr. 16, 2019

(54) CONTROL CABINET COOLING DEVICE WITH A CONDENSATE SEPARATOR

(71) Applicant: Rittal GmbH & Co. KG, Herborn (DE)

(72) Inventors: Andreas Meyer, Staufenberg/Hess. (DE); Thomas Klaner, Kirchhain (DE); Dieter Becker, Eschenburg (DE); Sebastian Chmura, Schoeffengrund (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 15/673,482

(22) Filed: Aug. 10, 2017

(65) Prior Publication Data

US 2018/0073768 A1    Mar. 15, 2018

(30) Foreign Application Priority Data

Sep. 15, 2016   (DE) .................. 10 2016 117 380

(51) Int. Cl.
| | |
|---|---|
| *F24F 13/22* | (2006.01) |
| *H05K 7/20* | (2006.01) |
| *F25D 21/14* | (2006.01) |

(52) U.S. Cl.
CPC .......... *F24F 13/222* (2013.01); *F25D 21/14* (2013.01); *H05K 7/207* (2013.01); *H05K 7/2059* (2013.01); *H05K 7/20572* (2013.01); *F24F 2013/227* (2013.01)

(58) Field of Classification Search
CPC .... F24F 13/222; F24F 13/22; F24F 2013/227; H05K 7/2059; H05K 7/20572; H05K 7/207; F25D 21/14
See application file for complete search history.

(56) References Cited

U.S. PATENT DOCUMENTS

2004/0011072 A1 * 1/2004 Inoue ............... F24F 1/022
62/408

FOREIGN PATENT DOCUMENTS

| CN | 102997393 A | | 3/2013 | |
|---|---|---|---|---|
| CN | 103609205 A | * | 2/2014 | ......... H05K 7/20745 |
| DE | 3714727 A1 | | 11/1988 | |
| DE | 19513201 C1 | | 11/1996 | |
| DE | 19712474 C1 | | 1/1998 | |
| JP | H09207554 A | | 8/1997 | |
| WO | 2012116724 A1 | | 9/2012 | |
| WO | WO 2012116724 A1 | * | 9/2012 | ......... H05K 7/20745 |

* cited by examiner

*Primary Examiner* — Emmanuel Duke

(74) *Attorney, Agent, or Firm* — Marshall & Melhorn, LLC

(57) ABSTRACT

A control cabinet cooling device (1) includes a housing (2) which comprises a hot air inlet (3) and a cooling air outlet (4), wherein the air to be cooled is suctioned by means of at least one fan (5) in the housing (2) via the hot air inlet (3) into the housing (2), led through an air-refrigerant heat exchanger (6) in the housing (2) and blown out as cooled air via the cooling air outlet (4), wherein a droplet separator (7) is arranged downstream of the air-refrigerant heat exchanger (6) in the air flow direction through the housing (2), wherein at least one lower end (8) of the droplet separator (7) in vertical direction is enclosed by an encapsulation (9) which, on the side thereof facing the droplet separator (7), comprises a condensate collection reservoir (10), into which a condensate discharge (11) of the droplet separator (7) leads.

14 Claims, 5 Drawing Sheets

CONTROL CABINET COOLING DEVICE WITH A CONDENSATE SEPARATOR

BACKGROUND OF THE INVENTION

The invention relates to a control cabinet cooling device with a housing comprising a hot air inlet and a cooling air outlet, wherein the air to be cooled is suctioned by means of at least one fan in the housing via the hot air inlet into the housing, led through an air-refrigerant heat exchanger in the housing and blown out via the air outlet as cooled air. A condensate separator designed as a droplet separator is arranged downstream of the air-refrigerant heat exchanger in the direction of air flow through the housing. Such a control cabinet cooling device is known from WO 2012/116724 A1. DE 37 14 727 C1 describes an air conditioning unit by means of which the condensate separator is designed as an inertial separator.

The control cabinet cooling devices known from the prior art have the disadvantage that the condensate removal occurs in an undefined manner in the bottom area of the control cabinet cooling device. This leads to uncontrolled collection of condensate in the control cabinet cooling device, for example, in condensate collection trays provided for this purpose. In addition, in the known condensate separators, condensate can occur on the cold outer sides thereof, which is not caught by the geometries for condensate removal, which are provided in the interior of the condensate separator and thus runs down uncontrolled on the outer periphery of the condensate separator, collecting accordingly in an undefined manner in the bottom area of the control cabinet cooling device.

SUMMARY OF THE INVENTION

Therefore, the aim of the invention is to further develop a control cabinet cooling device of the type mentioned at the beginning, in such a manner that a defined condensate removal is provided.

This aim is achieved by a control cabinet cooling device having the features of Claim 1. The dependent claims relate to respective advantageous embodiments of the invention.

Accordingly, it is provided that at least a lower end of the droplet separator in vertical direction is enclosed by an encapsulation which, on the side thereof facing the droplet separator, comprises a condensate collection reservoir into which a condensate discharge of the droplet separator leads. The droplet separator is preferably designed as an inertial separator and can have a plurality of air guide geometries which extend parallel to one another in a wavelike pattern and on which the condensate droplets occurring due to the air flow through the heat exchanger on the heat exchanger and entrained by the air flow remain suspended due to their inertia and are led due to gravity to the lower end of the droplet separator.

The encapsulation can be formed from a thermal insulation material, for example, from a foamed insulation material. The insulation material can be a plastic foam, for example, a PU foam material. The condensate discharge can comprise a condensate line which leads into the condensate collection reservoir and out of the housing.

The encapsulation can include at least one lower front side of the droplet separator in vertical direction as well as a lower end of an air outlet side of the droplet separator, as a result of which it is ensured that condensate occurring on the lower end of the droplet separator is can be led reliably into the condensate collection reservoir and removed via the condensate discharge.

The encapsulation can cover substantially the entire surface of vertical side walls of the droplet separator, which face one another in parallel and connects a respective air inlet side of the droplet separator to an air outlet side of the droplet separator, in order to prevent the formation of condensate on the side walls.

In order to also reliably remove condensate occurring on the air-refrigerant heat exchanger, which is not transported in the droplet separator, it is possible to provide that the air-refrigerant heat exchanger and the droplet separator are accommodated preferably at a distance apart from one another or immediately adjoining one another in the encapsulation, wherein an air inlet side of the air-refrigerant heat exchanger leads into an air inlet of the encapsulation, and an air outlet side of the droplet separator leads into an air outlet of the encapsulation. The encapsulation can comprise a bottom tray, into which the air-refrigerant heat exchanger and the droplet separator are inserted, as well as side panels which preferably completely cover the side walls of the air-refrigerant heat exchanger and of the droplet separator, in order to prevent the formation of condensate on the side walls.

An air inlet of the encapsulation can be formed as a nozzle, and an air outlet of the encapsulation can be formed as a diffuser. By increasing the speed with which the air flows through the heat exchanger and the condensate separator, it is achieved, on the one hand, that all the condensate occurring in the heat exchanger is entrained by the air flowing through and, on the other hand, remain suspended on the above-described air guide geometries of the inertial separator, so that the air exiting from the inertial separator or the encapsulation, is essentially not loaded with condensation droplets.

The encapsulation can be of modular structure, with at least one bottom tray in which the droplet separator is inserted via a lower front side thereof, and with at least one side panel connected via a plug-in connector to the bottom tray and preferably bonded thereto. The side panel can comprise several panel tiles which are connected via a plug-in connector to one another and preferably bonded to one another. The side panel or the panel tiles can completely cover the side walls of the air-refrigerant heat exchanger and of the condensate separator.

The housing can comprise a rack with a rectangular bottom group and a rectangular roof group consisting respectively of four horizontal struts as is known in principle from WO 2012/116724 A1. In an embodiment it is provided that, via fastening recesses in the horizontal struts, the encapsulation is fixed, in particular screwed, on the bottom group and/or on the roof group.

BRIEF DESCRIPTION OF THE DRAWINGS

Further details of the invention are explained in reference to the figures below.

DETAILED DESCRIPTION OF THE INVENTION

Figure 1:
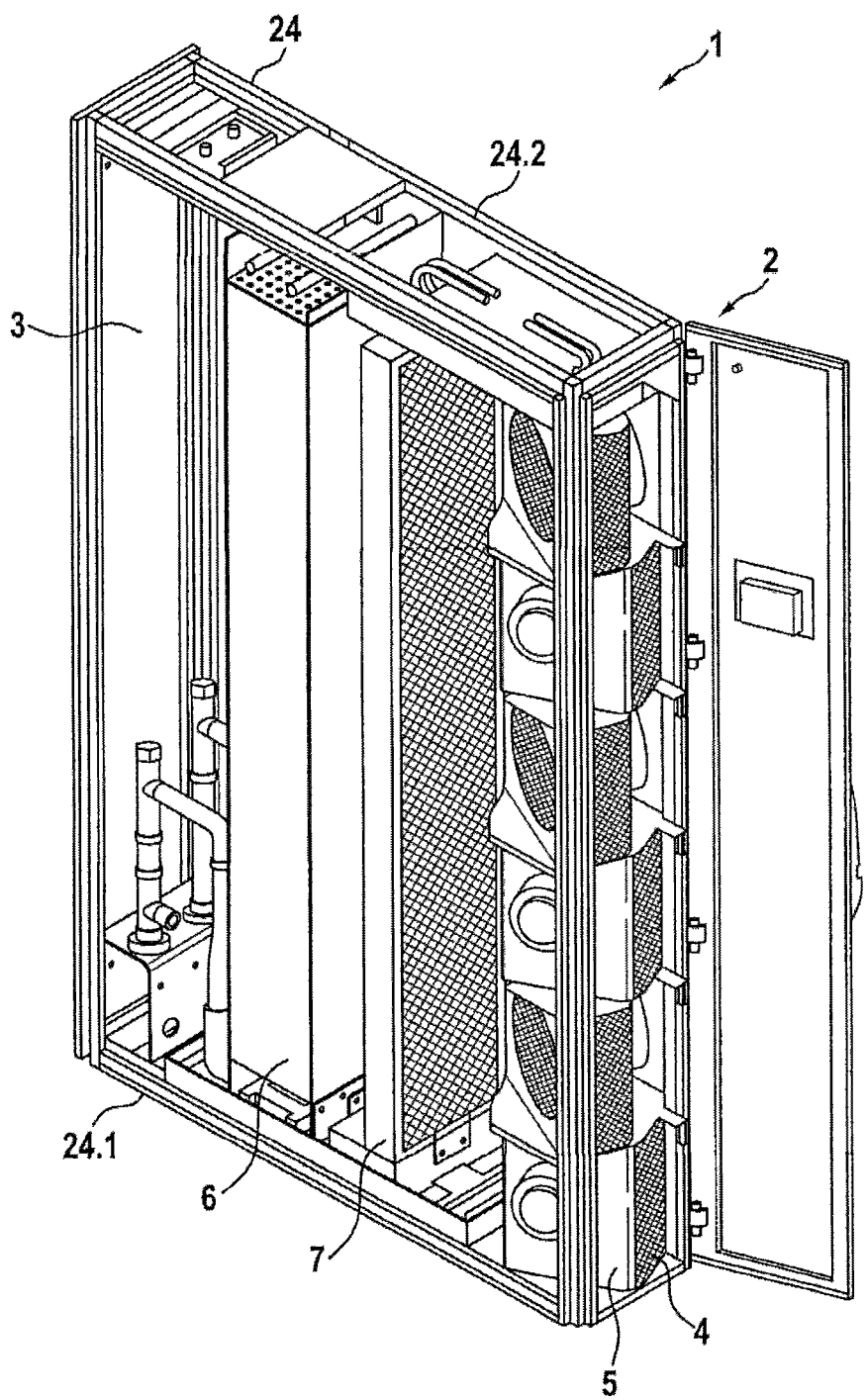
FIG. 1 shows a cooling device according to the prior art.

FIG. 1 shows a control cabinet cooling device 1 according to the prior art. Said control cabinet cooling device can be used, for example, as an inline cooling device which is inserted in control cabinet series, wherein the control cabinet series delimits a warm aisle from a cold aisle. On the back side, the cooling device 1 comprises a hot air inlet 3 through which it can suction hot air from the hot aisle and blow it out as cooled air via the air outlet 4 on the front side into the cold aisle. For the air transport, fans 5 are arranged vertically one above the other in the housing interior. The hot air suctioned via the hot air inlet 3 is led through an air-refrigerant heat exchanger 6 and cooled. Any droplet-loaded cooled air present is subsequently led through a droplet separator 7 downstream of the heat exchanger 6 in air flow direction through the housing 2. The droplet separator 7 comprises a knit wire mesh on which liquid droplets, which condense in the air-refrigerant heat exchanger 6 and are entrained by the air flowing through said heat exchanger, remain suspended and are thus kept from reaching the fans 5 and be transported by them into the cold aisle.

The housing 2 of the cooling device 1 comprises a rack 24 with a bottom group 24.1 and a roof group 24.2. Thus, the rack 24 consists of four vertical struts and eight horizontal struts. Through the air-refrigerant heat exchanger 6, a refrigerant is led, which is cooled via an external heat exchanger, for example a chiller, so that the heat exchanged by the air flowing through the cooling device 1 to the heat exchanger 6 can be removed from the cooling device 1, or from the computation center in which the cooling device is set up.

The cooling devices 1 known from the prior art have the disadvantage that, in particular at high air volume flows or at high air flow speeds, only relatively small quantities of the condensation water remain suspended on the droplet separator 7 and can thus be withdrawn effectively from the air flow. This leads to the cooling devices having to be operated at reduced air volume flow or reduced flow speed, in order to free the cooling air blown out via the cooling air outlet 4 sufficiently from liquid droplets. For the purpose of nevertheless achieving high flow speeds and volume flows and in order to avoid critical states, this has lead in the past to maintaining the process air at an excessively low relative air humidity by means of other measures, which require a relatively involved regulation, for example, dew point regulation. In particular, it was necessary to monitor and regulate the cooling media temperatures very accurately. In order to avoid the formation of condensation water, it was consequently necessary to avoid to the extent possible variations in the temperatures of the cooling media.

Figure 2:
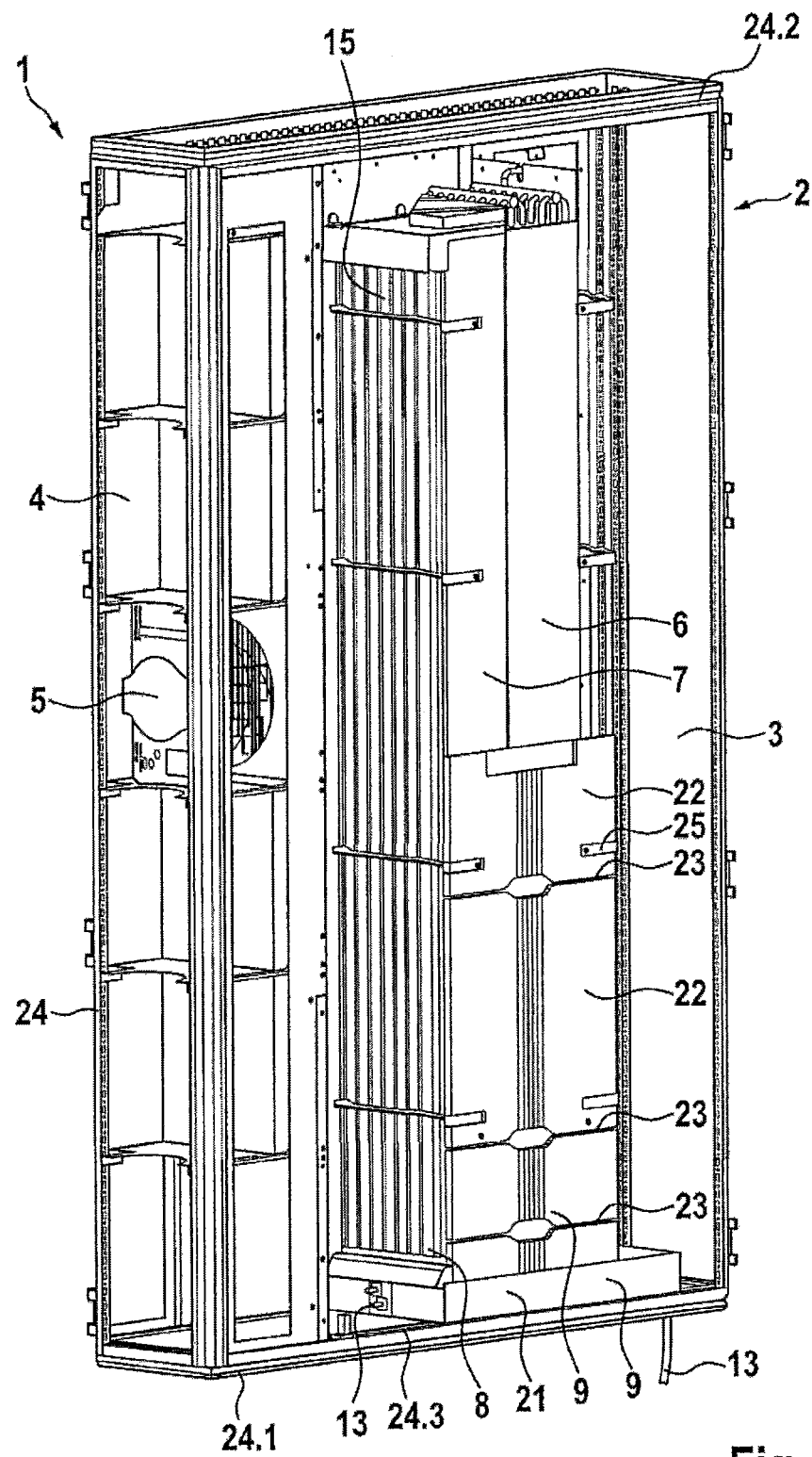
FIG. 2 shows an embodiment of a control cabinet cooling device according to the present invention.

FIG. 2 shows an embodiment of the control cabinet cooling device 1 according to the invention. Analogously to the cooling devices 1 known from the prior art, said control cabinet cooling device can comprise a housing 2 with a rack 24 which consists of a bottom group 24.1 and a roof group 24.2, which are connected to one another via parallel vertical struts. In the representation according to FIG. 2, only one fan 5 is included in the drawing on the front side of the cooling device 2, which is associated with the cooling air outlet 4. In order to achieve a homogeneous air volume flow in vertical direction through the heat exchanger 6 and the droplet separator 7, it is, however, provided that, in accordance with the arrangement in FIG. 1, a plurality of fans 5 are arranged one above the other in vertical direction, of which, however, only one is included in the drawing to simplify the representation.

One can see that the heat exchanger 6 and the droplet separator 7 rest via the lower end 8 thereof in a bottom tray 21 of an encapsulation 9, so that the lower end of the heat exchanger 6 and of the droplet separator 7 are accommodated partially within the bottom tray 21. On opposite sides, the bottom tray 21 comprises a respective condensate line 13 through which the condensate occurring in the bottom tray 21 can be removed in a controlled manner.

Figure 3:
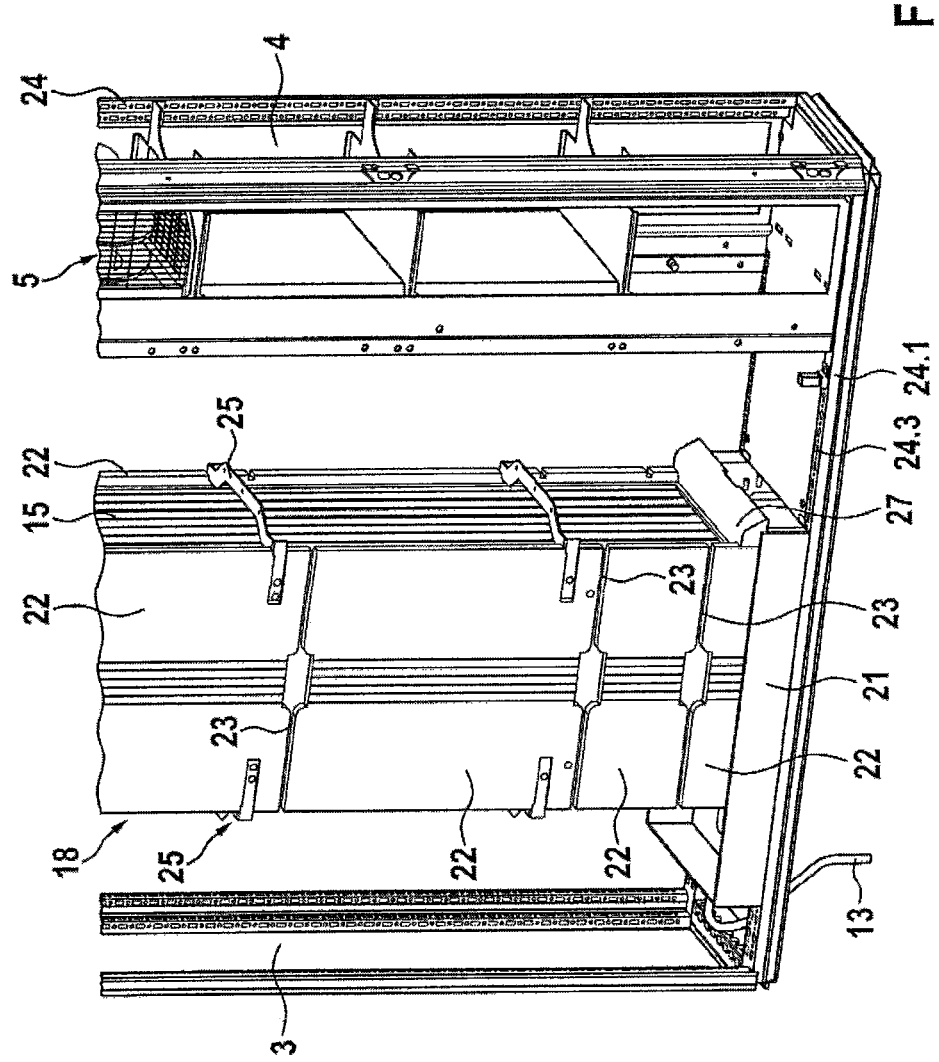
FIG. 3 shows a detail view of the lower end of the cooling device according to FIG. 2.

A detail view of the lower area of the cooling device 1 according to FIG. 2 is shown in FIG. 3. In conjunction with FIG. 2, one can see here that, on the sides of the heat exchanger 6 and of the droplet separator 7, which are oriented perpendicularly to the hot air inlet 3 and the cooling air outlet 4, a side panel 22 is arranged in each case. Each side panel 22 consists of several panel tiles 22.1 which can be connected to one another via plug-in connectors 23 and bonded to one another, for example. The holding clamps 25 which bridge the air outlet side 15 or the air inlet side 18 and which fix the two facing side panels 22 against one another are arranged so as to fix the side panels 22 on the heat exchanger 6 and the droplet separator 7. An air guide geometry 27 on the lower end of the air outlet side 15 functions as a diffuser.

Figure 4:
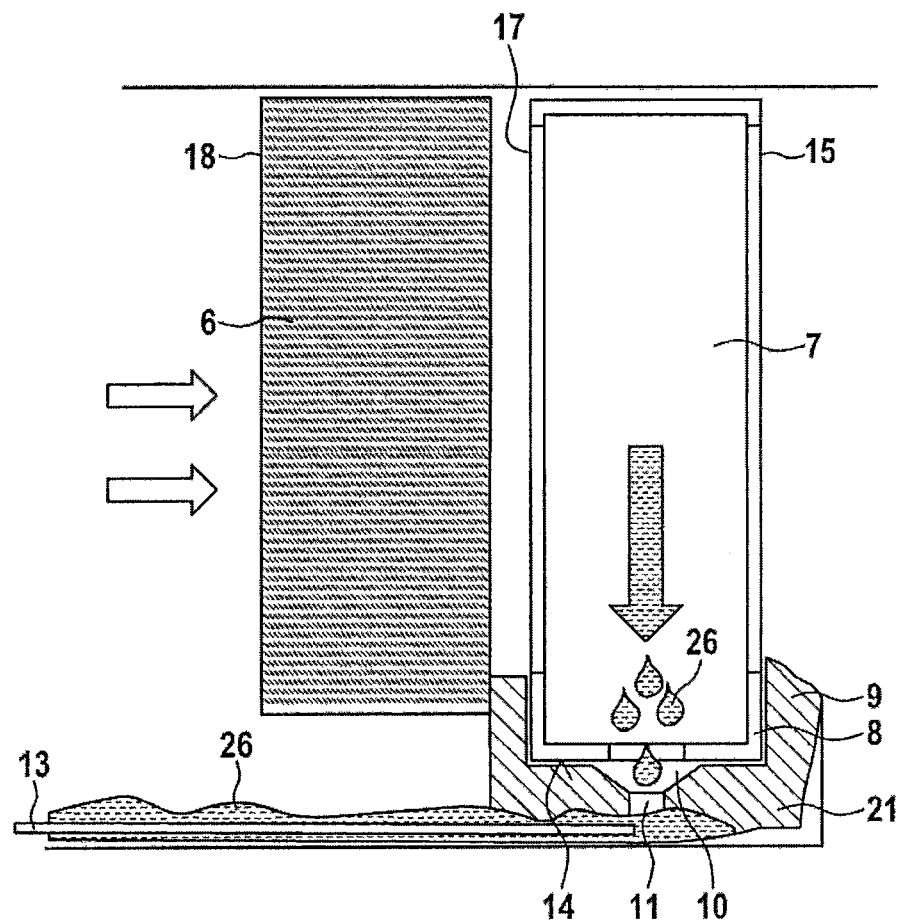
FIG. 4 shows a diagrammatic representation of an embodiment of a control cabinet cooling device in vertical cross section.

An additional embodiment is shown in FIG. 4. In this embodiment, only the droplet separator 7 is accommodated in the encapsulation 9, wherein, in the cross-sectional view according to FIG. 4, only the bottom tray 21 of the encapsulation 9 can be seen. Furthermore, in accordance with the embodiments in FIGS. 2 and 3, the encapsulation 9 can comprise facing side panels 22. The side panels 22 can be formed, in particular, from a thermally insulating material, for example, from a foamed plastic such as PU foam and thus effectively prevent the formation of condensation water on the outer surfaces of the droplet separator 7 or also, in the embodiments according to FIGS. 2 and 3, on the outer side of the air-refrigerant heat exchanger 6.

The embodiment according to FIG. 4 illustrates how the droplet separator 7 is accommodated via a lower end 8 thereof in the bottom tray 21 of the encapsulation 9, so that occurring condensate conveyed by gravity in direction of the lower end 8 of the droplet separator 7 can be effectively channeled, in particular transferred into the condensate collection reservoir 10 of the encapsulation 9. The condensate collection reservoir 10 can comprise, for example, a groove-shaped channel or funnel geometry. The condensate collection reservoir 10 leads into a condensate discharge 11 which is emptied via a condensate line 13. The encapsulation 9 thus has a dual function. On the one hand, it ensures that the occurring condensate can be channeled in a defined manner, and, on the other hand, due to the thermal insulation properties thereof, it prevents the formation of condensate on the outer periphery of the droplet separator 7, which otherwise could also cause an uncontrolled condensate discharge.

Figure 5:
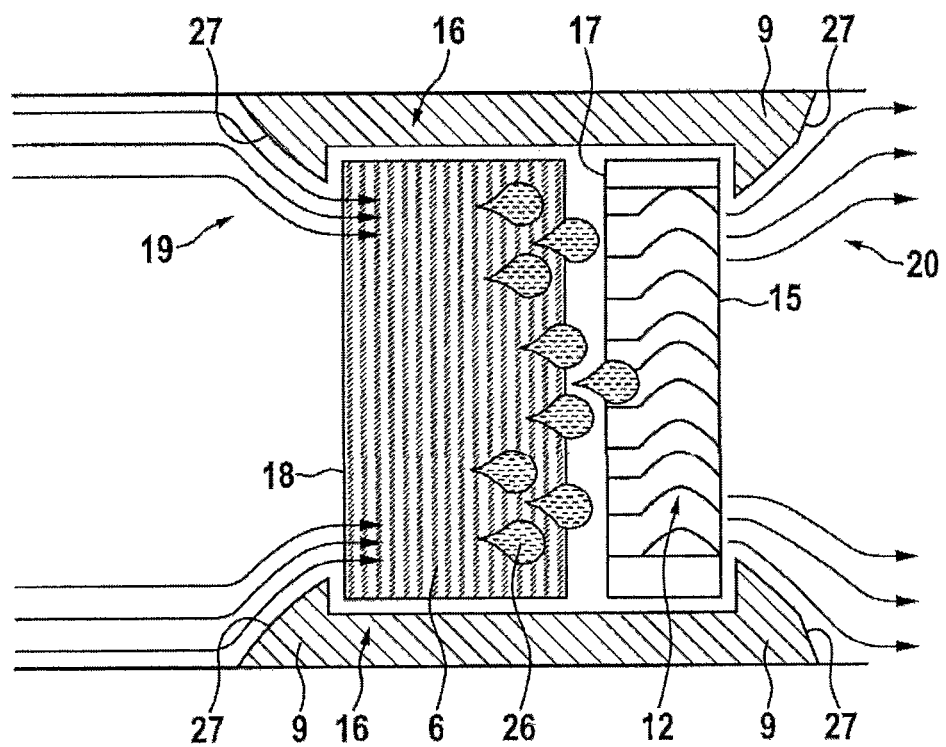
FIG. 5 shows a diagrammatic representation of an additional embodiment of a control cabinet cooling device in horizontal cross section.

In comparison to the embodiment represented in FIG. 4, in the embodiment represented in FIG. 5, the air-refrigerant heat exchanger 6 is also accommodated in the encapsulation 9. However, in contrast to FIG. 4 which shows a side cross-sectional view, FIG. 5 shows a horizontal cross-sectional view of the embodiment. However, this view shows that the air inlet 19 of the encapsulation 9 is formed via a first airline geometry 27 like a nozzle, while the air outlet 20 of the encapsulation 9 is formed via a second air guide geometry 27 like a diffuser. In this manner, one achieves that the air flows at increased speed through the air-refrigerant heat exchanger 6 and the droplet separator 7, as a result of which, on the one hand, effectively all the occurring condensate is effectively torn away from the air-refrigerant heat exchanger 6 and at the same time removed in the droplet separator 7 from the air. The droplet separator 7 comprises corrugated air guide plates 12 on which the liquid droplets entrained by the air flowing through the droplet separator 7 remain suspended due to the inertia thereof.

The features disclosed in the above description, in the drawings as well as in the claims can be essential both individually and also in any combination for the embodiment of the invention.

LIST OF REFERENCE NUMERALS

1 Control cabinet cooling device
2 Housing
3 Hot air inlet
4 Cooling air outlet
5 Fan
6 Air-refrigerant heat exchanger
7 Droplet separator
8 Lower end
9 Encapsulation
10 Condensate collection reservoir
11 Condensate discharge
12 Air guide plates
13 Condensate line
14 Lower front side
15 Air outlet side
16 Side wall
17 Air entry side
18 Air inlet side
19 Air inlet
20 Air outlet
21 Bottom tray
22 Side panel
22.1 Panel tile
23 Plug-in connector
24 Rack
24.1 Bottom group
24.2 Roof group
24.3 Fastening recess
25 Holding clamp
26 Condensate
27 Air guide geometry

What is claimed:

1. A control cabinet cooling device with a housing which comprises a hot air inlet and a cooling air outlet, wherein the air to be cooled is suctioned by means of at least one fan in the housing via the hot air inlet into the housing, led through an air-refrigerant heat exchanger in the housing and blown out as cooled air via the cooling air outlet, wherein a droplet separator is arranged downstream of the air-refrigerant heat exchanger in the air flow direction through the housing, characterized in that at least one lower end of the droplet separator in vertical direction is enclosed by an encapsulation which, on the side thereof facing the droplet separator, comprises a condensate collection reservoir, into which a condensate discharge of the droplet separator leads, and wherein the encapsulation covers half or more of the surface of two vertical side walls of the droplet separator, which face one another in parallel, and which in each case connect an air inlet side of the droplet separator to an air outlet side of the droplet separator.

2. The control cabinet cooling device according to claim 1, in which the condensate discharge comprises a condensate line which leads into the condensate collection reservoir and out of the housing.

3. The control cabinet cooling device according to claim 1, in which the encapsulation includes at least one lower front side of the droplet separator in vertical direction as well as a lower end of an air outlet side of the droplet separator.

4. The control cabinet cooling device according to claim 1, in which the encapsulation is formed from a foamed thermal insulation material.

5. The control cabinet cooling device according to claim 1, in which the encapsulation is formed from a plastic foam.

6. The control cabinet cooling device according to claim 1, in which the air-refrigerant heat exchanger and the droplet separator are accommodated, spaced apart from one another or immediately adjoining one another, in the encapsulation, wherein an air inlet side of the air-refrigerant heat exchanger leads into an air inlet of the encapsulation, and an air outlet side of the droplet separator leads into an air outlet of the encapsulation.

7. The control cabinet cooling device according to claim 1, in which an air inlet of the encapsulation is formed as a nozzle, and an air outlet of the encapsulation is formed as a diffuser.

8. The control cabinet cooling device according to claim 1, in which the encapsulation has a modular structure, with at least one bottom tray in which the droplet separator is inserted via the lower front side thereof, and with at least one side panel which is connected via a plug-in connector to the bottom tray.

9. The control cabinet cooling device according to claim 8, in which the side panel comprises several panel tiles which are connected to one another via a plug-in connector.

10. The control cabinet cooling device according to claim 8, in which the side panel comprises several panel tiles which are connected to one another via a plug-in connector and bonded to one another.

11. The control cabinet cooling device according to claim 1, in which the encapsulation has a modular structure, with at least one bottom tray in which the droplet separator is inserted via the lower front side thereof, and with at least one side panel which is connected via a plug-in connector to the bottom tray and bonded thereto.

12. The control cabinet cooling device according to claim 1, in which the housing comprises a rack with a rectangular bottom group and a rectangular roof group each consisting of four horizontal struts, wherein the encapsulation is fixed via fastening recesses in the horizontal struts on the bottom group and/or on the roof group.

13. A control cabinet cooling device with a housing which comprises a hot air inlet and a cooling air outlet, wherein the air to be cooled is suctioned by means of at least one fan in the housing via the hot air inlet into the housing, led through an air-refrigerant heat exchanger in the housing and blown out as cooled air via the cooling air outlet, wherein a droplet separator is arranged downstream of the air-refrigerant heat exchanger in the air flow direction through the housing, characterized in that at least one lower end of the droplet separator in vertical direction is enclosed by an encapsulation which, on the side thereof facing the droplet separator, comprises a condensate collection reservoir, into which a condensate discharge of the droplet separator leads, wherein the encapsulation has a modular structure, with at least one bottom tray in which the droplet separator is inserted via the lower front side thereof, and with at least one side panel which is connected via a plug-in connector to the bottom tray; and the side panel comprises several panel tiles which are connected to one another via a plug-in connector.

14. A control cabinet cooling device with a housing which comprises a hot air inlet and a cooling air outlet, wherein the air to be cooled is suctioned by means of at least one fan in the housing via the hot air inlet into the housing, led through an air-refrigerant heat exchanger in the housing and blown out as cooled air via the cooling air outlet, wherein a droplet separator is arranged downstream of the air-refrigerant heat exchanger in the air flow direction through the housing, characterized in that at least one lower end of the droplet separator in vertical direction is enclosed by an encapsulation which, on the side thereof facing the droplet separator, comprises a condensate collection reservoir, into which a condensate discharge of the droplet separator leads; wherein the encapsulation has a modular structure, with at least one bottom tray in which the droplet separator is inserted via the lower front side thereof, and with at least one side panel which is connected via a plug-in connector to the bottom tray; and the side panel comprises several panel tiles which are connected to one another via a plug-in connector and bonded to one another.

* * * * *